United States Patent
Khandros et al.

(10) Patent No.: US 7,548,055 B2
(45) Date of Patent: *Jun. 16, 2009

(54) TESTING AN ELECTRONIC DEVICE USING TEST DATA FROM A PLURALITY OF TESTERS

(75) Inventors: Igor Y. Khandros, Orinda, CA (US); Benjamin N. Eldridge, Danville, CA (US); Charles A. Miller, Fremont, CA (US); A. Nicholas Sporck, Saratoga, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/696,582

(22) Filed: Apr. 4, 2007

(65) Prior Publication Data
US 2007/0182438 A1    Aug. 9, 2007

Related U.S. Application Data

(63) Continuation of application No. 10/820,319, filed on Apr. 8, 2004, now Pat. No. 7,202,687.

(51) Int. Cl.
*G01R 31/28* (2006.01)
(52) U.S. Cl. .................... 324/158.1; 324/763
(58) Field of Classification Search ......... 324/763–765, 324/750, 501; 714/726, 733; 340/870.01
See application file for complete search history.

(56) References Cited

U.S. PATENT DOCUMENTS

| | | | |
|---|---|---|---|
| 5,225,775 A | 7/1993 | Sekino | |
| 5,539,325 A | 7/1996 | Rostoker et al. | |
| 5,621,312 A | 4/1997 | Achor et al. | |
| 5,764,655 A | 6/1998 | Kirihata et al. | |
| 5,825,193 A | 10/1998 | Nakata et al. | |
| 6,028,439 A * | 2/2000 | Arkin et al. | 324/765 |
| 6,137,303 A | 10/2000 | Deckert et al. | |
| 6,161,205 A | 12/2000 | Tuttle | |
| 6,219,810 B1 * | 4/2001 | Debenham | 714/724 |
| 6,236,223 B1 * | 5/2001 | Brady et al. | 324/765 |
| 6,246,251 B1 | 6/2001 | Gallagher | |
| 6,331,782 B1 * | 12/2001 | White et al. | 324/763 |
| 6,759,863 B2 | 7/2004 | Moore | |
| 6,820,028 B2 | 11/2004 | Ye et al. | |
| 6,885,202 B2 | 4/2005 | Slupsky | |
| 7,202,687 B2 | 4/2007 | Khandros et al. | |
| 7,218,094 B2 | 5/2007 | Khandros et al. | |
| 7,253,651 B2 | 8/2007 | Khandros et al. | |

(Continued)

OTHER PUBLICATIONS

U.S. Appl. No. 11/835,151, filed Aug. 7, 2007, Khandros et al.

*Primary Examiner*—Vinh P Nguyen
(74) *Attorney, Agent, or Firm*—N. Kenneth Burraston

(57) ABSTRACT

A method and apparatus for testing a set of electronic devices can comprise placing electronic devices into a test station. A plurality of testers can provide test data to the test station. The test station can test the electronic devices using test data received from the plurality of testers. One of the testers can communication with another of the testers regarding the testing of the electronic devices. Probes can be used to contact the electronic devices, and one of the electronic devices can be contacted by more than one of the probes.

5 Claims, 11 Drawing Sheets

U.S. PATENT DOCUMENTS

2005/0086021 A1 4/2005 Khandros et al.
2005/0174131 A1 8/2005 Miller
2007/0210822 A1 9/2007 Khandros et al.

* cited by examiner

TESTING AN ELECTRONIC DEVICE USING TEST DATA FROM A PLURALITY OF TESTERS

CROSS-REFERENCE TO RELATED APPLICATION(S)

This application is a continuation of U.S. patent application Ser. No. 10/820,319, filed Apr. 8, 2004, now U.S. Pat. No. 7,202,687.

BACKGROUND

Although this invention is generally applicable to test systems and methods in general, it is particularly suited for semiconductor device testing.

As is known, semiconductor devices are typically manufactured many at a time as "dies" on a semiconductor wafer, after which the dies are further processed before being shipped to customers or installed in various products. That further processing may take many forms. In perhaps the most common post-manufacture processing, the dies are probed and tested while still in wafer form. Thereafter, the dies are singulated from the wafer, and the dies that passed the initial probe testing are packaged, burned in, and further tested. In another common process, the dies are not packaged after being singulated from the wafer but are further tested and often burned in to produce "known good dies," which are unpackaged dies that have been fully tested. In more advanced processes, the dies are burned in and fully tested while in wafer form.

In all of these exemplary post-manufacture processes, as well as other scenarios in which electronic devices of any kind are tested, there is a need to control testing and/or exercising of the dies or other electronic devices.

BRIEF SUMMARY

The present invention relates generally to wireless transmission of test signals. In an exemplary embodiment of the invention, a base controller disposed in a test cassette receives test data for testing a plurality of electronic devices. The base controller wirelessly transmits the test data to a plurality of wireless test control chips, which write the test data to each of the electronic devices. The wireless test control chips then read response data generated by the electronic devices, and the wireless test control chips wirelessly transmit the response data to the base controller.

DETAILED DESCRIPTION OF EXEMPLARY EMBODIMENTS

The present invention relates generally to wireless transmission of test signals. This specification describes exemplary embodiments and applications of the invention. The invention, however, is not limited to these exemplary embodiments and applications or to the manner in which the exemplary embodiments and applications operate or are described herein.

Figure 1:
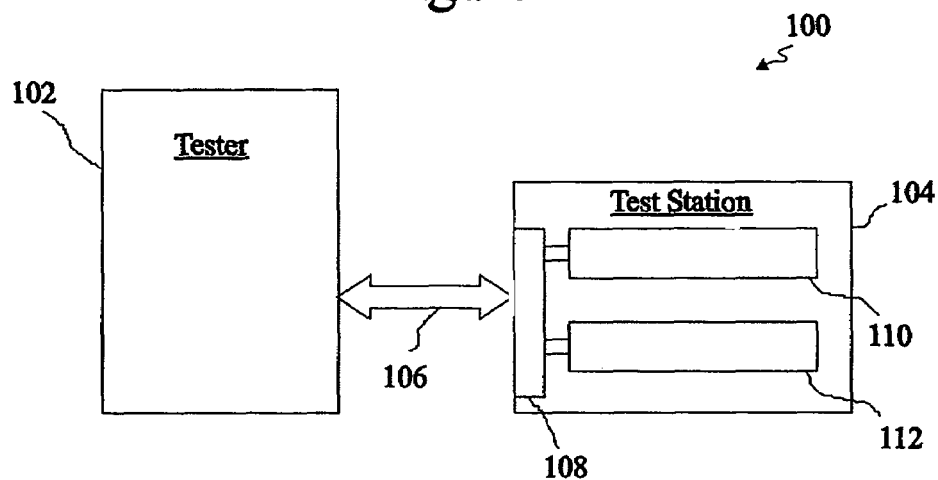
FIG. 1 illustrates an exemplary test system.

FIG. 1 illustrates an exemplary test system 100 for testing electronic devices, such as semiconductor dies. Test system 100 includes a tester 102, a test station 104, and a communications link 106. Tester 102 may be any tester for testing electronic devices, such as semiconductor dies of an unsingulated semiconductor wafer or singulated dies (packaged or unpackaged). Such testers are known, and any suitable tester may be used. Test station 104 includes one or more cassettes 110 and 112 (two are shown for purposes of illustration). The cassettes 110 and 112 hold the electronics devices to be tested and are electrically connected to a communications back plane 108. A communications link 106, which may be any type of communications link, including without limitation a cable, fiber optics, a twisted pair, a wireless communications link, etc., provides communications between tester 102 and test station 104. As just one example, communications link 106 may be wireless as described in U.S. patent application Ser. No. 10/690,170, filed Oct. 21, 2003 and entitled "Wireless Test System," by Khandros et al., which is incorporated in its entirety herein by reference. Back plane 108 provides an interface to communications link 106 and each of the cassettes 110 and 112 and thus, electrically connects communications link 106 to each of cassettes 110 and 112. In the basic operation of test system 100, tester 102 generates test data that is communicated to the electronic devices under test in each cassette 110 and 112. Response data generated by the devices under test are sent back to the tester 102. The communications path between the tester 102 and the devices under test includes communications link 106, back plane 108, and the cassettes 110 and 112.

Figure 2A:
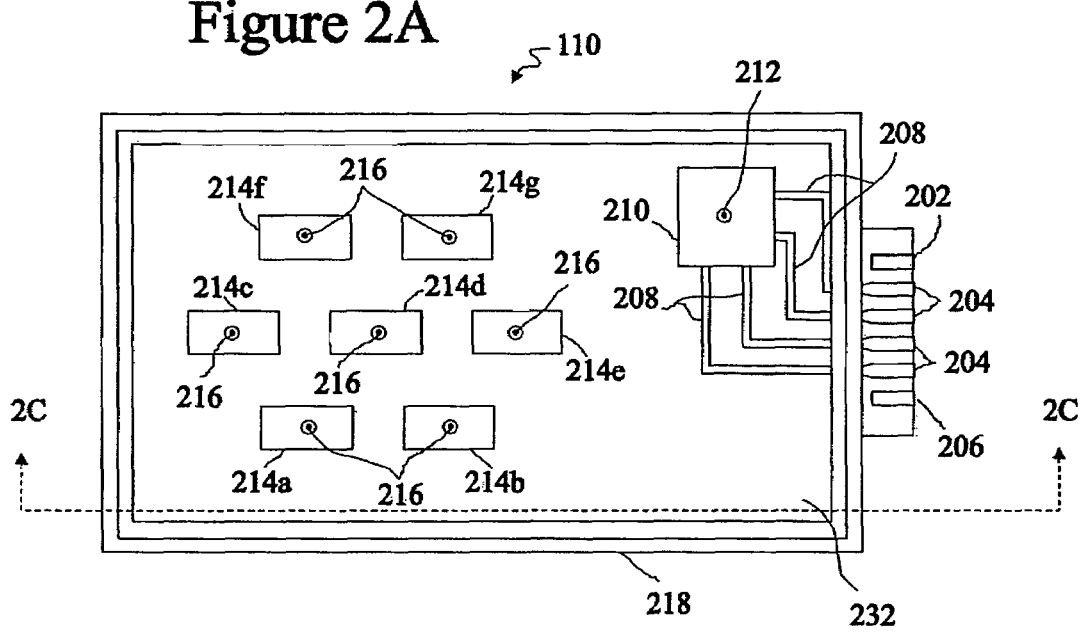
FIG. 2A illustrates a top view of an exemplary cassette with its cover removed.
Figure 2B:
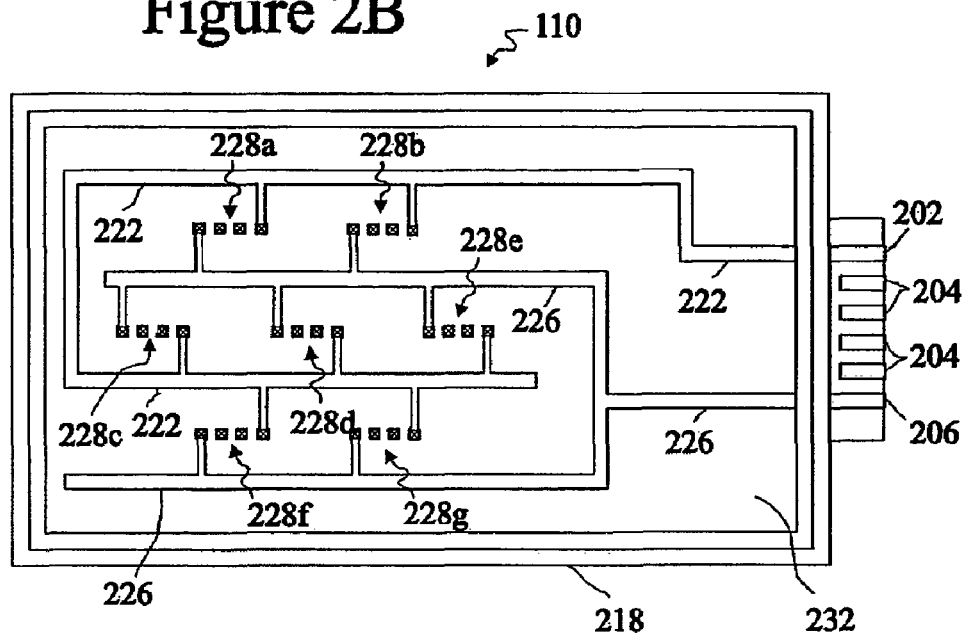
FIG. 2B illustrates a bottom view of the cassette of FIG. 2A with its device plate removed.
Figure 2C:
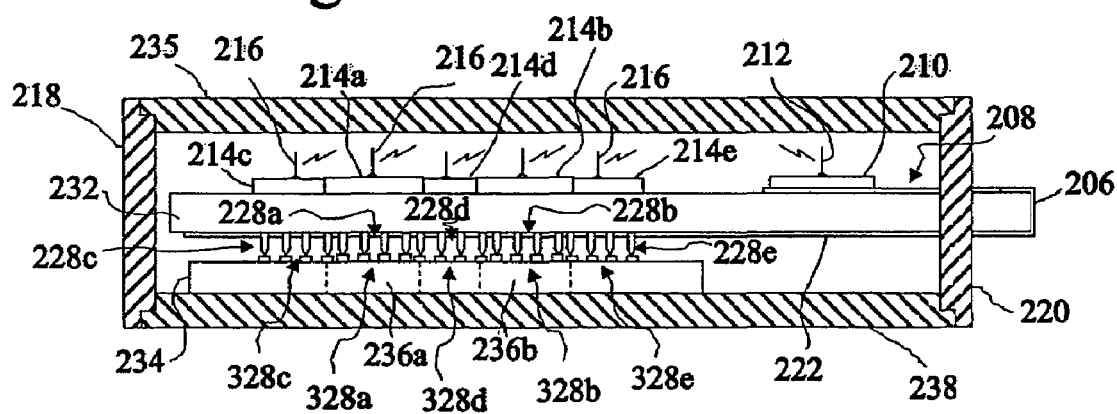
FIG. 2C illustrates a cross-sectional side view of the cassette of FIG. 2A with its cover and device plate.

FIGS. 2A, 2B, and 2C illustrate an exemplary embodiment of a cassette 110. Cassette 112 may be similar. (FIG. 2A shows a top view of the cassette 110 with its cover 235 removed; FIG. 2B shows a bottom view of the cassette 110 with the device plate 238 removed; FIG. 2C shows a cross-sectional side view of the cassette 110 with the cover 235 and device plate 238 in place.)

Figure 3:
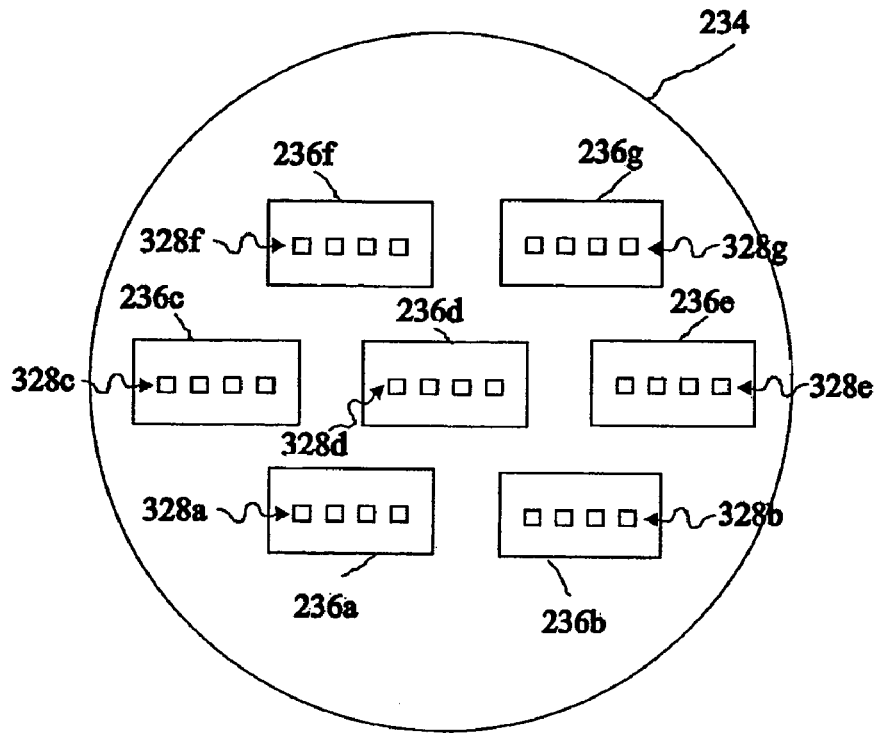
FIG. 3 illustrates an exemplary wafer.

The exemplary cassette 110 shown in FIGS. 2A-2C includes a frame 218, a cover 235, and a device plate 238 for holding the electronic devices to be tested. In this example, the electronic devices to be tested are the dies of an unsingulated wafer 234, which is shown in FIG. 3. As shown in FIG.

3, exemplary wafer 234 comprises seven dies 236a, 236b, 236c, 236d, 236e, 236f, and 236g, and each die includes a set of four terminals 328a, 328b, 328c, 328d, 328e, 328f, and 328g in which the outer terminals are for ground and power, respectively, and the inner two terminals are for data input/ output into and out of the die. (The number and arrangement of the dies on the wafer as well as the number and arrangement of terminals on each die are for illustration and discussion purposes only; any number and arrangement of dies on the wafer and terminals on each die may be used. For example, the dies may be arranged in columns as well as rows. Moreover, the dies may be any type of integrated circuit chip, including without limitation a memory chip, a microprocessor or microcontroller, a signal processor, an analog chip, an application specific integrated circuit (ASIC), a digital logic circuit, etc.) The devices being tested need not, however, be dies of an unsingulated wafer but may be any type of electronic devices, including without limitation singulated dies (packaged or unpackaged). For example, device plate 238 may include a tray for holding singulated dies. Referring again to FIGS. 2A, 2B, and 2C, the frame 218, cover 235, and device plate 238 form an enclosure. In the enclosure are a test board 232 (which may be a printed circuit board, a ceramic, multi-layer substrate, semiconductor wafer, silicon wafer, or other wiring substrate) and the wafer 234 (or singulated dies), which is supported by the device plate 238.

The test board 232 includes a plurality of edge connectors 202, 204, and 206 that extend outside of the enclosure formed by the frame 218, cover 235, and device plate 238 to make electrical connections with back plane 108. As will be seen, edge connectors 202 and 206 are for power and ground. Edge connectors 204, on the other hand, are for data signals. (The term data is used herein broadly to include data signals, address signals, control signals, status signals, etc., and test signals generated by the tester that are to written to the dies and response signals generated by the dies.) Edge connectors 204 make electrical connections with back plane 108, and as shown in FIG. 2A, conductive traces 208 electrically connect each of edge connectors 204 with a base controller (or base controller) 210. It should be apparent that base controller 210 is thus provided with communications channels to and from the tester 102. That is, communications link 106, back plane 108, edge connectors 204, and traces 208 provide communications channels between tester 102 and base controller 210. Test data generated by the tester 102 to test a die 236 of wafer 234 travels from the tester over these channels to the base controller 210, and response data generated by the dies 236 likewise travels over these channels from the base controller to the tester. As discussed above and shown in FIG. 3, the dies 236a, 236b, 236c, 236d, 236e, 236f, and 26gof wafer 234 each include a set of four terminals 328a, 328b, 328c, 328d, 328e, 328f, and 328g. The outer two terminals in each set of terminals 328 are for power and ground, and the inner two terminals are for data input and output. In this example, two channels to the tester are required to test one die—one channel for each data input/output terminal on a die 236. As shown in FIG. 2A, there are four channels between base controller 210 and tester 102. Thus, in this simplified example, base controller 210 receives sufficient test data from tester 102 to test only two dies. As will be seen, however, base controller 210 transmits the test data it receives from the tester 102 to a plurality of wireless test control chips 214, which communicate the test data to the dies 236. By configuring the interface between the base controller 210 and the wireless test control chips, the number of dies actually tested may be increased.

As shown in FIG. 2A, test board 232 includes seven wireless test control ("WTC") chips 214a, 214b, 214c, 214d, 214e, 214f, and 214g, each of which functions as a test controller. (In this example, there is one WTC chip 214 for each die 236 on wafer 234; a ratio of WTC chips to dies other than one-to-one, however, may be implemented.) Base controller 210 includes a transceiver 212, and each of the WTC chips 214 also includes a transceiver 216. Base controller 210 is thus able to communicate with each of the WTC chips 214 wirelessly.

As shown in FIG. 2B, test board 232 includes seven sets of conductive probes 228a, 228b, 228c, 228d, 228e, 228f, and 228g in which each set has four probes. (Probes 228 may be any type of probes, including without limitation needle probes, buckling beam probes, bumps, posts, and spring probes. Nonexclusive examples of spring probes include the spring contacts described in U.S. Pat. Nos. 5,917,707, 6,255, 126, 6,475,822, and 6,491,968; and U.S. Patent Application Publication No. 2001/0044225 A1, U.S. Patent Application Publication No. 2001/0012739 A1, and U.S. Patent Application Publication No. 2002/0132501 A1. The foregoing patents and patent applications are incorporated herein by reference in their entirety.) Each set of probes 228 corresponds to one of the dies 236 on wafer 234, and more specifically, each probe in each set corresponds to one of the four terminals 328 of a die 236. Corresponding to the four terminals on each die 236, the two inner probes in each set of probes 228 correspond to the data input/output terminals on each die 236, and the two outer probes in each set of probes 228 correspond to the power and ground terminals on each die 236. Each WTC chip 214 is electrically connected by conductive vias (not shown) through the test board 232 to the two inner probes of a probe set 228. Thus, each WTC chip 214 can be electrically connected to the data input/output terminals 328 of a die 236 of wafer 234. Although probes 228a-228g are illustrated in FIGS. 2B and 2C as attached to test board 232, probes 228a-228g may alternatively be attached to the terminals of dies 236a-236g, and probes 228a-228g on test board 232 may be replaced with pads. As yet another alternative, probes 228a-228g may float between pairs of pads in which one pad in each pair is on test board 232 and the other pad in each pair is on wafer 234. Other alternatives are also possible. For example, the probes may be pogo pins, and configurations as shown in U.S. Pat. No. 2002/0132501 A1 may be used. Additional pads, burnps, probes (not shown) etc. may be present for a variety of possible uses.

It should be apparent that the base controller 210 wirelessly interfaces the four channels discussed above between the base controller and the tester 102 with a plurality of WTC chips 214, each of which provides electrical connections to the data input/output terminals of the dies 236 being tested. In the example shown, and as discussed above, there are sufficient channels between the tester 102 and the base controller 210 to test only two dies 214 at a time. Through the wireless interface between the base controller 210 and the WTC chips 214, however, seven dies 236 are tested. The ration of four channels to seven dies is exemplary only and other ratios may be used. Indeed, by simply changing the number of WTC chips 214 and reconfiguring the wireless interface between the base controller 210 and the WTC chips 214, the number of dies 236 actually tested may be changed without changing the number of channel connections to the tester 102.

As shown in FIG. 2B, the outer probes (which correspond to the power and ground terminals 328 on each die 236) in each probe set 228 are connected by conductive trace 222 or conductive trace 226 to edge connector 202 or 206, which in turn are connected to a power source and ground, respectively, through back plane 108. That is, the right most (relative to FIG. 2B) probe in each probe set 228 is connected by trace 222 to edge connector 202, which is connected to a power source through back plane 108. Similarly, the left most (relative to FIG. 2B) probe in each probe set 228 is connected by trace 226 to edge connector 206, which is connected to ground through back plane 108. The ultimate source of power and ground may be the tester 102 (which supplies power and ground through communications link 106) or some other source, including a source internal to test station 104 or cassette 110. Isolation resistors (not shown) or other means of electrical isolation (e.g., voltage regulators, separate power supplies, etc.) may be used to isolate electrically each power probe on test board 232 and thereby electrically isolate the dies during testing. This prevents one failed die from disabling the test system. Decoupling capacitors may also be included, as is known in the field. Such isolation resistors or other means of electrical isolation may be disposed wherever convenient (e.g., on the test board or even incorporated into the dies).

The enclosure formed by frame 218, cover 235, and device plate 238 may be sealable, hermetically or otherwise, as needed to meet any applicable clean room standard or other needs. As known in the field, gaskets (not shown) and/or sealing materials (not shown) may be provided with frame 218, cover 235, and device plate 238 to accomplish this. A mechanism (not shown) for holding the frame, cover, and device together may also be included. In addition, the cassette 110 may optionally include shielding to electrically shield wafer 234 and the wireless components. The cassette 110 may also optionally include a heating and/or a cooling device (not shown) to control the temperature of the wafer 234. Alternatively, the cassette may be coupled to an external temperature control system (not shown). Cassette 110 may also include means (not shown) for securing itself to the back plane 108 or other part of the test station 104.

Figure 2D:
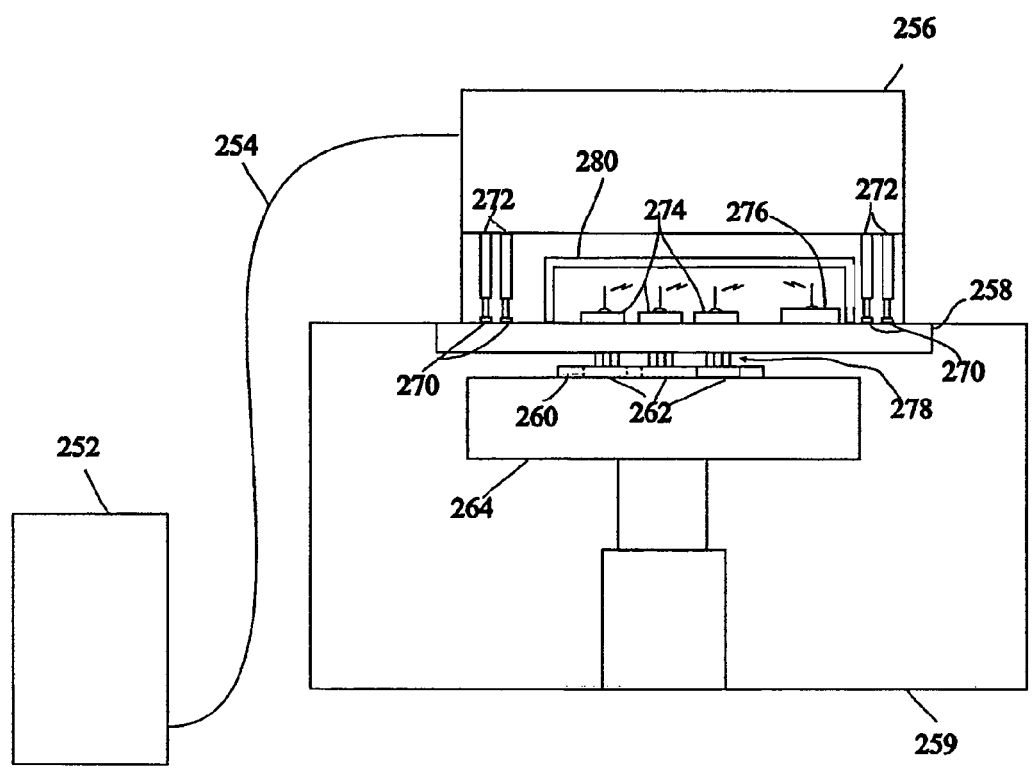
FIG. 2D illustrates an exemplary probing system.

FIG. 2D illustrates an alternative embodiment of a "cassette" in which the "cassette" is modified for use in a semiconductor prober 259. FIG. 2D includes block diagrams of the basic elements of a prober test system for testing semiconductor devices. As is known, a tester 252 generates test data for testing semiconductor dies. The test data is communicated over a communications link 254 to a probe head 256, through pogo-pins 272 or other electrical connectors, to terminals 270 of a probe card 258. The test data then passes through the probe card to probes 278 that contact terminals (not shown) of the dies 262 to be tested. The prober 259 includes a moveable chuck 264 for supporting and moving the wafer 260 that comprises the dies 262 being tested. It should be noted that, although the dies 262 shown in FIG. 2D are being tested in wafer form, the dies 262 could alternatively be singulated from the wafer first and then fixed in position on the chuck 264 for testing. Response data generated by the dies is communicated back to the tester 252 through the probe card 258, the probe head 256, and communications link 254.

The terminals 270 of probe card 258 are connect to a base controller 276, which communicates wirelessly with WTC chips 274. Base controller 276 may be generally similar to base controller 210 in FIGS. 2A-2C. WTC chips 274 may likewise be similar to WTC chips 214(a)-214(g) in FIGS. 2A-2C. Base controller 276 and WTC chips 274 may operate and communicate with each other as described above with respect to base controller 210 and WTC chips 214(a)-214(g). Power and ground may be delivered to dies 262 directly from selected ones of terminals 270, just as power and ground is delivered directly from edge connectors 202 and 206 in FIGS. 2A-2C. A shielding enclosure 280 for electrically shielding base controller 276 and WTC chips 274 may optionally be included.

Figure 4:
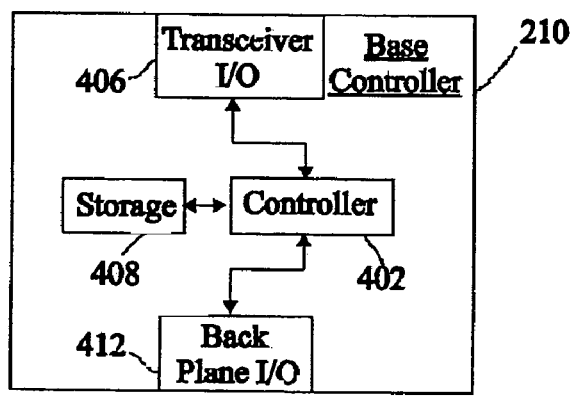
FIG. 4 illustrates a simplified, block diagram of an exemplary base controller.

FIG. 4 shows a simplified block diagram of an exemplary base controller 210, which may be implemented as one or more integrated circuits. As shown, base controller 210 includes a controller 402, data storage 408, back plane input/output circuitry 412, and transceiver input/output circuitry 406. Controller 402 controls overall operation of the base controller 210. Controller 402 may comprise a microprocessor operating under software control. Alternatively, controller 402 may comprise hardwired logic circuits, or controller 402 may comprise a combination of a microprocessor and hardwired logic circuits. Storage 408 provides memory for storing data and/or software to be run on controller 402. Back plane input/output circuitry 412 provides for input of signals from and output of signals to conductive traces 208. The transceiver input/output circuitry 406 provides for output of signals to transceiver 212 that are to be transmitted to one or more WTC chips 214 and input of signals received by transceiver 212 from a WTC chip.

Figure 5:
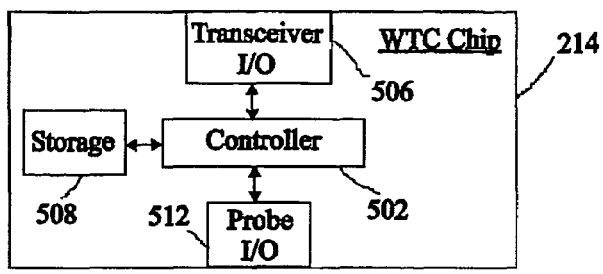
FIG. 5 illustrates a simplified, block diagram of an exemplary wireless communications control chip.

FIG. 5 shows a simplified block diagram of an exemplary WTC chip 214, which may be implemented as one or more integrated circuits. Some or all of the WTC chip may be integrated into the electronic devices being tested (e.g., if the electronic devices being tested are semiconductor dies, part or all bf the WTC chip may be integrated into the dies). As shown, WTC chip 214 includes a controller 502, data storage 508, probe input/output circuitry 512, and transceiver input/output circuitry 506. Controller 502 controls overall operation of the WTC chip 214. Like controller 402, controller 502 may comprise a microprocessor operating under software control, hardwired logic, or a combination of a microprocessor and hardwired logic. Storage 508 provides memory for storing data and/or software to be run on controller 502. Probe input/output circuitry 512 provides for output of signals to probes 228 and input of signals from probes. The transceiver input/output circuitry 506 provides for output of signals to transceiver 216 that are to be transmitted to the base controller 210 and input of signals received by transceiver 216 from the base controller 210. A WTC chip 214 may optionally include power management circuitry for managing delivery of power to the dies. Alternatively, power management circuitry may be provided on test board 232 or built into the dies themselves.

Figure 6:
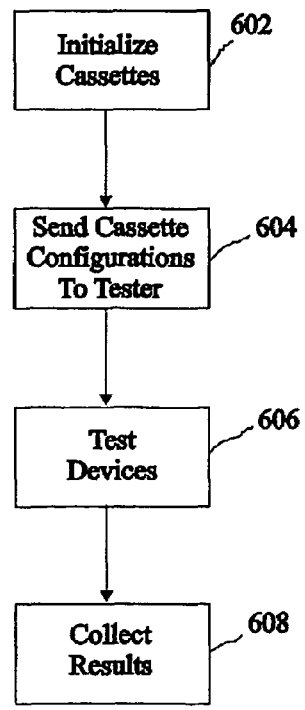
FIG. 6 illustrates exemplary operation of the test system of FIG. 1.

FIG. 6 illustrates exemplary operation of the test system 100 shown in FIG. 1. At step 602, the cassettes 110 and 112 are initialized, which may include such things as each WTC chip 214 in a cassette transmitting an identifier to the base controller 210 in the cassette, and establishing a timing or code based protocol for communications by a WTC chip to the base controller. For example, time division or frequency division multiplexing may be established for communications from multiple WTC chips 214 to the base controller 210 on a cassette. As another example, communications by a particular WTC chip 214 may be allowed only in response to polling by the base controller 210. A cassette 110 may have multiple base controllers 210, and if so, initialization may include assigning each WTC chip 214 in the cassette to a particular base controller 210 to achieve, for example, balanced data through put. If there are multiple base controllers, each base controller 210 may communicate with its assigned WTC chips 214 on a different frequency, or each base controller 210 may include a code identifying itself so that even though all of the WTC chips 214 receive transmissions from a particular base controller, the WTC chips 214 respond only to their assigned base controller. The WTC chips 214 may constitute a "self organizing network" that on power up seeks a configuration consistent with acceptable data transfer or behavior needs.

At step 604, the base controllers 210 in each cassette 110 and 112 send information to the tester 102 describing the configuration of each cassette. The dies 236 of the wafers 234 in the cassettes 110 and 112 are then tested at step 606, and results of the testing are collected at step 608. It should be noted that the step of collecting results 608 may begin before testing 606 has completed, and thus, steps 606 and 608 may operate, at least in part, concurrently. Steps 606 and 608 may be repeated as necessary, and steps 602 and 604 may be repeated as testing in a particular cassette finishes and new cassettes are added to the system with dies to be tested.

Figure 7:
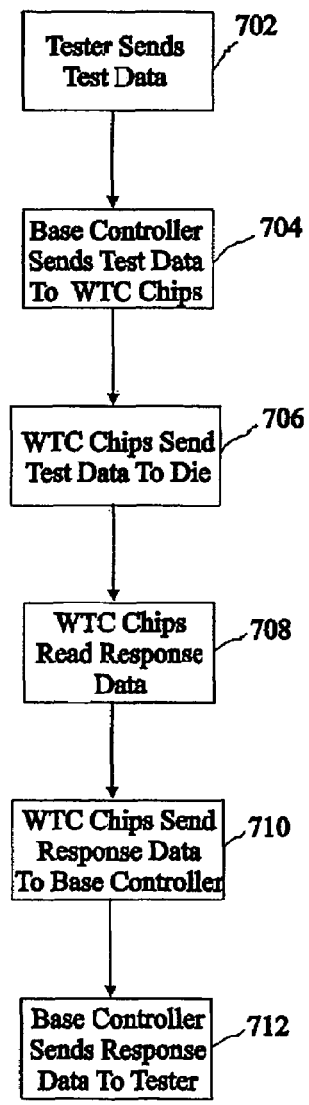
FIG. 7 illustrates exemplary operation of steps 606 and 608 of FIG. 6.

An exemplary implementation of steps 606 and 608 is shown in FIG. 7. At step 702, tester 102 sends test data and/or instructions over communication link 106 to the back plane 108 of test station 104. At step 704, the base controller 210 in each cassette 110 and 112 receives the test data and/or instructions and wirelessly broadcasts to each of the seven WTC chips 214a, 214b, 214c, 214d, 214e, 214f, and 214g on its cassette. If the test data for each die is the same, which is likely because the dies on the wafer would typically be the same, the base controller 210 may simply transmit the test data to all seven of the WTC chips 214. Alternatively, the base controller 210 may transmit one device specific test command to each of the WTC chips (e.g., 214a, 214b, 214c, 214d, 214e, 214f, and 214g). The base controller 210 may transmit selectively only to one or a subset of the seven WTC chips 214 in any of a number of ways. For example, the base controller 210 may transmit to one set of WTC chips 214 on one frequency and transmit to another set of WTC chips on a different frequency. As another example, the base controller 210 may include in its transmission a code identifying the intended recipients of the transmission. Data may be compressed before being transmitted.

The test data may be test vectors that are simply to be passed through to the WTC chips 214 without significant modification. Alternatively, the base controller 210 may modify the test data, or the test data received from the tester 102 may be commands that cause the base controller 210 to generate other commands or test vectors that are broadcast as test data to the WTC chips 214. At step 706, each WTC chip 214 passes the test data it received from the base controller 210 at step 704 to its corresponding die 236. The test data passed from a WTC chip 214 to its corresponding die 236 may be the same as the test data received by the WTC chip 214 from the base controller 210. Alternatively, the WTC chip 214 may modify the test data, or the test data received from the base controller 210 may be a command or commands that cause the WTC chip 214 to generate other commands or test vectors that are sent as test data to the corresponding die 236. The test data received by a die may be test vectors that are simply written into each die 236. Alternatively, the test data received by a die 236 may include test commands that cause built-in-self-test (BIST) circuitry (not shown) on the die 236 to execute self tests as is known in the field. Other types of test data may also be used.

At step 708, a WTC chip 214 reads response data generated by its die 236 in response to the test data. The WTC chip 214 reads the responds data from a die 236 through probes 228 that are in contact with the die. At step 710, the WTC chip 214 sends the response data wirelessly via its transceiver 216 to the transceiver 212 of the base controller 210. At step 712, the base controller 210 sends the response data to the tester 102 via traces 208, edge connectors 204, back plane 108, and communications link 106. The response data is preferably sent to the tester 102 with an identifier identifying the die 236 that produced the response data. Data compression or any of a variety of transmission techniques may optionally be used. One or more of steps 702, 704, 706, 708, 710, and 712 may be repeated as needed.

It should be apparent that there are a variety of ways to implement steps 708, 710, and 712. For example, response data may be buffered at a WTC chip 214 until testing of its corresponding die 236 is complete, after which the WTC chip signals its base controller 210 and then wirelessly transmits all of the response data generated by the die. As another example, response data may be buffered at a base controller 210 until testing of all of the dies 236 in the cassette is completed, after which the base controller sends all of the response data to the tester 102. Other variations are possible. For example, controller 502 in WTC chip 214 may perform calculations or otherwise analyze response data generated by the dies and transmit to the base controller 210 the results of such calculations or analysis. The controller 402 may likewise analyze response data and send its analysis to the tester 102.

Figure 8:
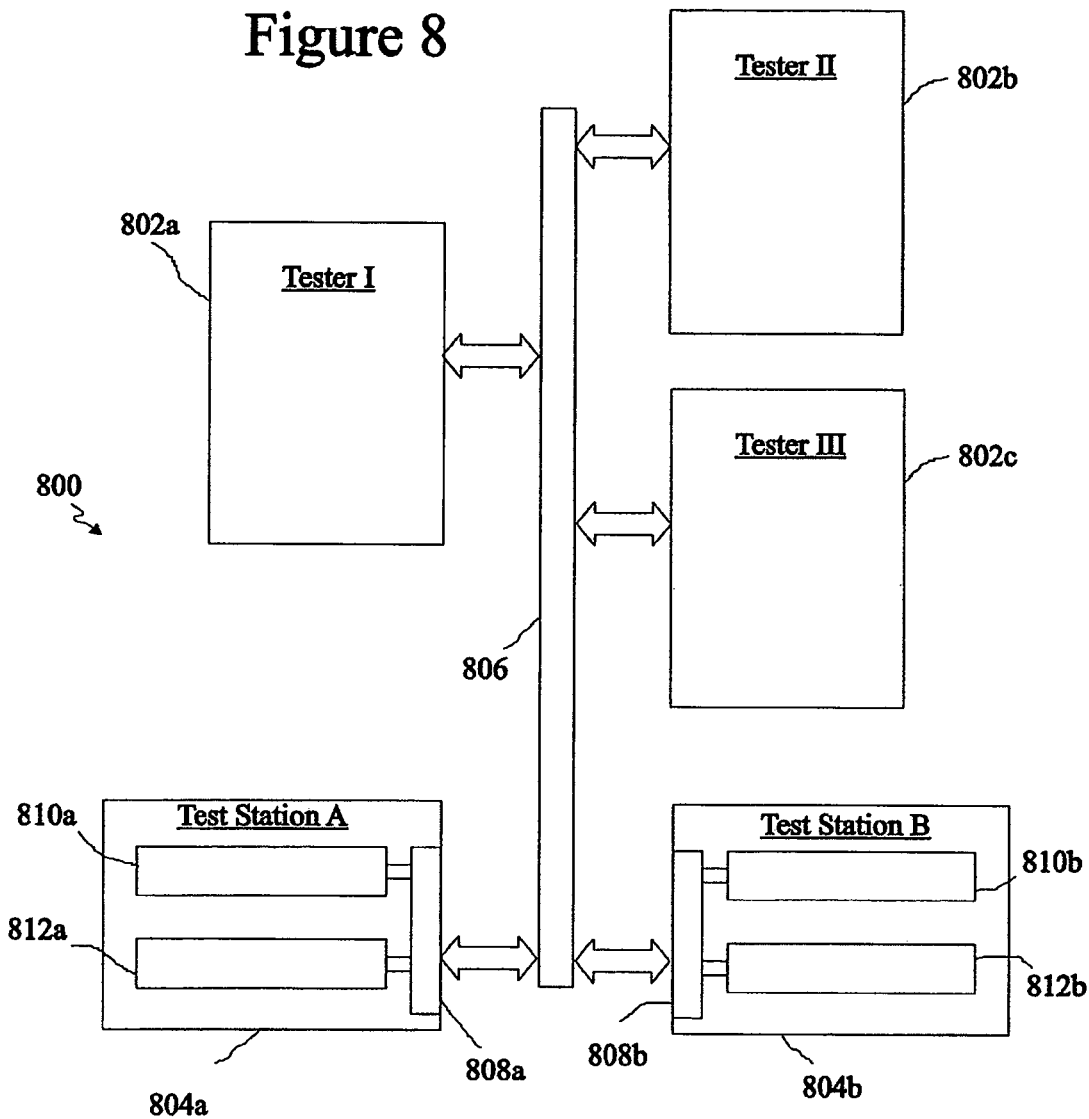
FIG. 8 illustrates another exemplary test system.

FIG. 8 illustrates another exemplary test system 800, which includes three testers—tester I 802a, tester II 802b, and tester III 802c—and two test stations—test station A 804a and test station B 804b. Each of tester I 802a, tester II 802b, and tester III 802c may be generally similar to tester 102, which is described above. Likewise, each of test station A 804a and test station B 804b may be generally similar to test station 104, which is also described above. Cassettes 810a, 812a, 810b, and 812b may be similar to cassette 110 as illustrated in FIGS. 2A, 2B, 2C, 4, and 5 and described above. The wafers (not shown in FIG. 8) in each cassette 810a, 812a, 810b, 812b may be generally similar to wafer 234 shown in FIG. 3 and also described above. Communications link may be any type of link, including the types of communications links discussed above with respect to communications link 106 of FIG. 1. Other elements may optionally be included in the system shown in FIG. 8. For example, a data base (not shown) may be included for storing test data. The data base (not shown) may be connected to all of the testers and store test data for all of the electronic devices being tested.

With multiple testers and multiple test stations, test system 800 may be configured in many different ways. For example, test system 800 may be configured such that more than one tester runs tests on the devices in a particular test station. That is, one tester may run tests on the devices in a test station, after which another tester may run tests on the devices in the same test station. As another example, multiple testers may run tests on multiple test stations at the same time.

Figure 9:
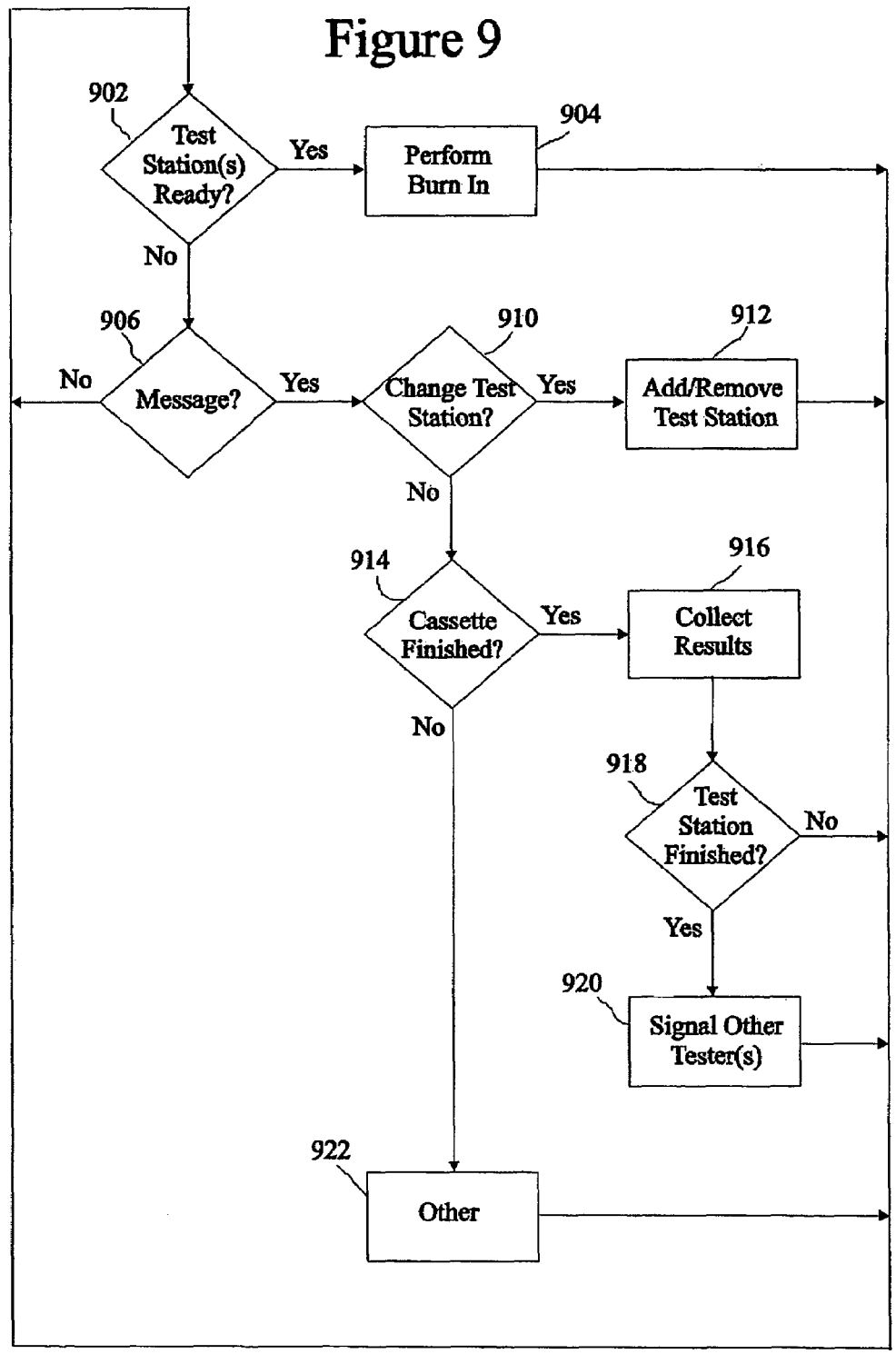
FIG. 9 illustrates exemplary operation of tester I 802a of the test system of FIG. 8.
Figure 10:
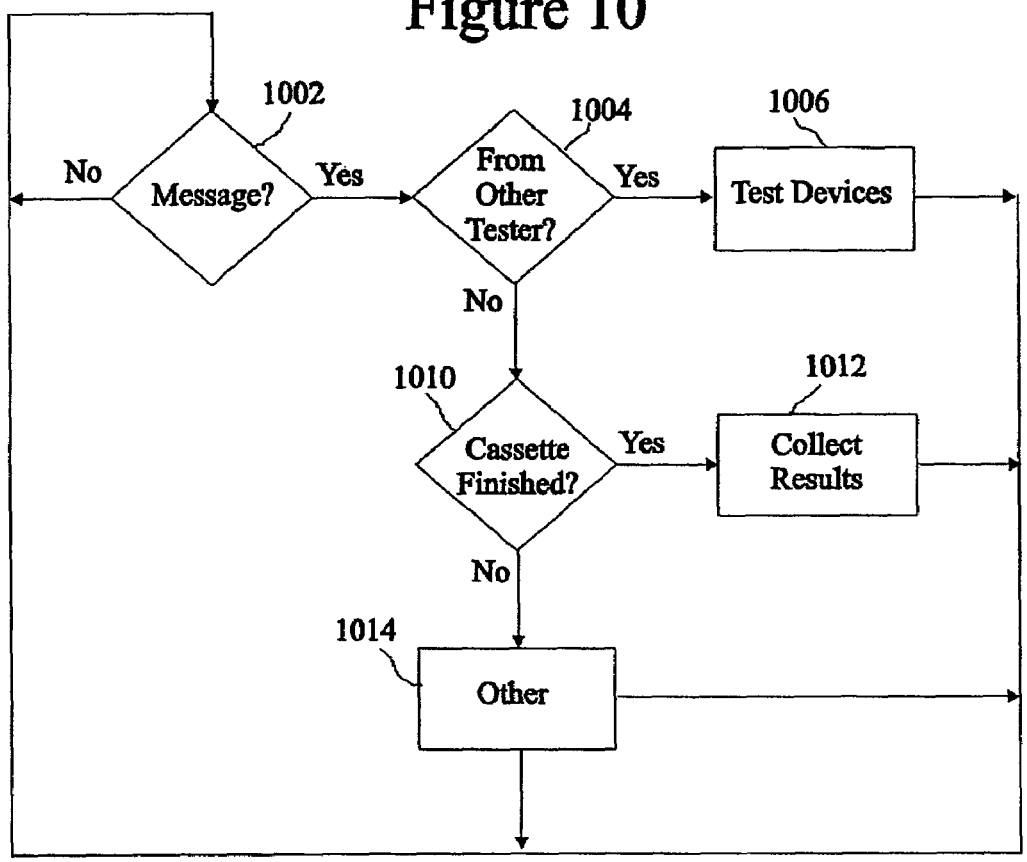
FIG. 10 illustrates exemplary operation of tester II 802b of the test system of FIG. 8.
Figure 11:
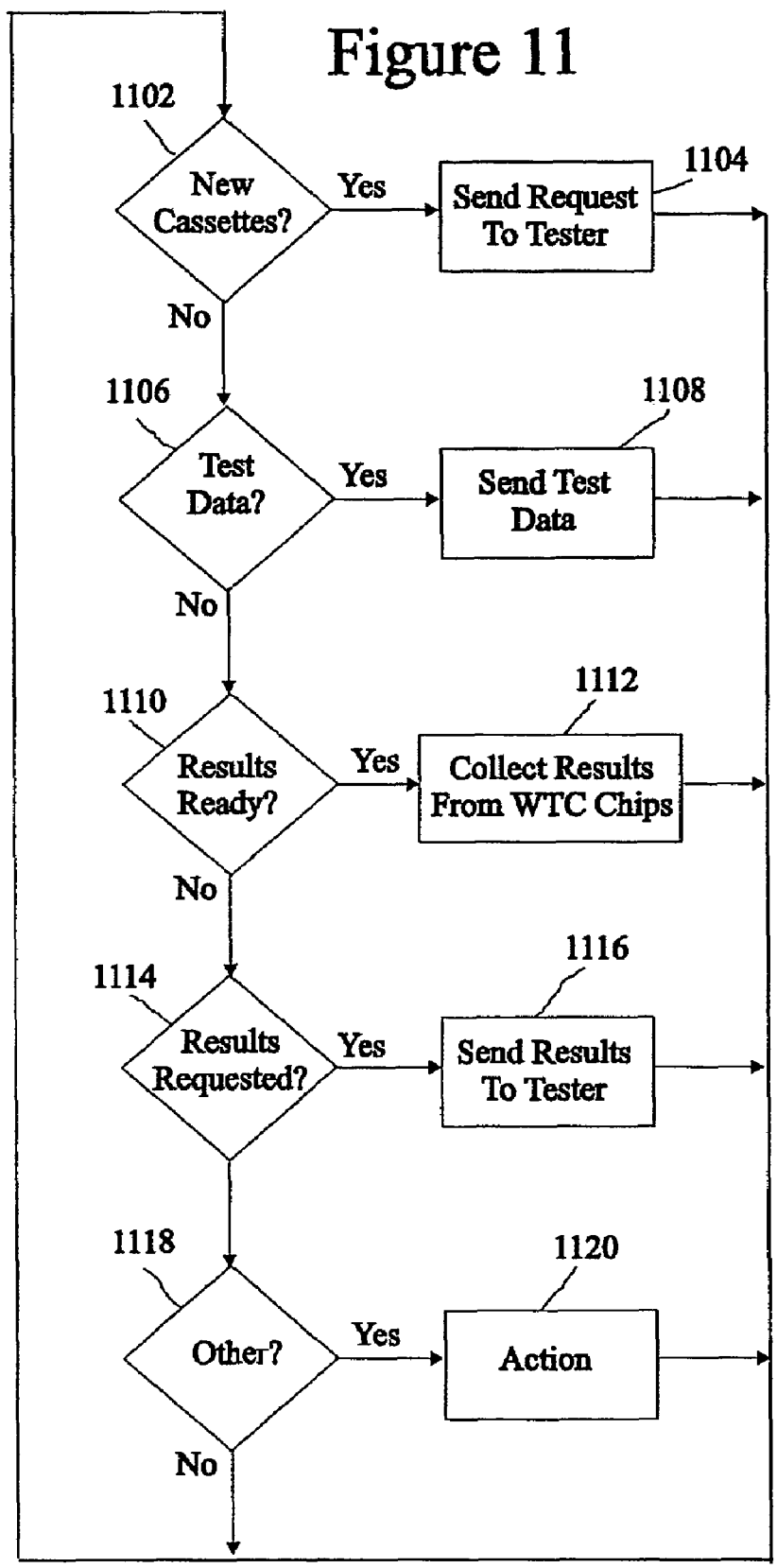
FIG. 11 illustrates exemplary operation of a base controller in cassette 810a of the test system of FIG. 8.

FIGS. 9, 10, and 11 illustrate exemplary operation of the test system of FIG. 8. For purposes of illustrating exemplary operation of FIGS. 9, 10, and 11, it is assumed that the cassettes 810a and 812a in test station A 804a and the cassettes 810b and 812b in test station B 804b contain the same type of unsingulated semiconductor wafers. It is further assumed that the wafers in each cassette first undergo dynamic burn-in (including some testing during burn in) followed by full functional testing. Tester I 802a controls burn-in, and tester II 802b and tester III 802c control functional testing. Tester I 802a has sufficient resources to manage burn in of the wafers simultaneously in two test stations, but tester II 802b and tester III 802c have sufficient resources to functionally test the wafers in only one test station. All of the foregoing assumptions are only for purposes of simplifying this illustration and discussion and are not limiting. Many variations are possible. For example, the wafers in a test station may be different.

As will be seen, tester I 802*a* initiates burn-in of the wafers in both test station A 804*a* and test station B 804*b*. Once burn in is completed at test station A 804*a*, tester I 802*a* sends a message to tester II 802*b*, which causes tester II 802*b* to initiate functional testing in test station A 804*a*. Similarly, once burn in is completed at test station B 804*b*, tester I 802*a* sends a message to tester III 802*c*, which causes tester III 802*c* to initiate functional testing in test station B 804*b*.

Turning now to FIG. 9, that figure illustrates exemplary operation of tester I 802*a*, which as described above, is configured to perform burn in and has sufficient resources to perform burn in on the wafers in two test stations. (The process of FIG. 9 may be implemented in software stored in a memory (not shown) and run on a controller (not shown) in tester I 802*a*, as is known in the field.) At step 902, tester I 802*a* determines whether one or more test stations have wafers that are ready for burn in. As discussed below with respect to steps 1102 and 1104 of FIG. 11, once new wafers are loaded into the cassettes of a test station, that test station sends a message to tester I 802*a* indicating that it has new wafers that are ready for burn in. In this example, it is assumed that new wafers were loaded into test station A 804*a* and test station B 804*b*, and both test stations sent messages to tester I 802*a* indicating that they are ready for burn in. Thus, the process of FIG. 9 branches from step 902 to step 904.

At step 904, tester I 802*a* initiates burn in of the wafers in the cassettes in both test station A 804*a* and test station B 802*b*. There are many ways to burn in a semiconductor wafer, and any suitable way may be used. For example, the burn in may be static or dynamic, and dynamic burn in may include providing clock signals to the dies of the wafer in the cassettes 810*a*, 812*a*, 810*b*, and 812*b* or actual functional exercise of the dies. For purposes of this discussion, it is assumed that the tester I 802*a* causes each die of the wafers in the cassettes 810*a*, 812*a*, 810*b*, and 812*b* to be functionally exercised and tested during burn in. Thus, at step 904, tester I 802*a* broadcasts a command or commands over communication link 806 to test station A 804*a* and test station B 804*b* that powers up all of the dies in cassettes 810*a*, 812*a*, 810*b*, and 812*b* and sets the temperature in each of the cassettes to a desired temperature. For example, the temperature in each cassette may be set to an elevated temperature. Alternatively, the temperature may be set to a cold temperature. These commands may be received and executed by the base controllers 210 in each of cassettes 810*a*, 812*a*, 810*b*, and 812*b*.

As mentioned above, it is assumed for purposes of this example that Tester I 802*a* performs limited tests on the dies during burn in. Accordingly, after setting the temperature in the cassettes and powering up the dies, tester I 802*a* sends test data over communications link 806 to the base controllers 210 in each of cassettes 810*a*, 812*a*, 810*b*, and 812*b*. This may be accomplished as generally described above with respect to step 702 of FIG. 7. Of course, performing burn in at step 904 may require multiple sub-steps and may be time consuming. During execution of step 904, the process may periodically check for messages as at step 906 or new test stations as at step 902.

After step 904 (that is, after burn in is completed), the process of FIG. 9 branches back to step 902, where it is determined whether there are additional test stations that are ready for burn in. It is possible that one or more test stations were loaded with new wafers and added to system 800, in which case, the process of FIG. 9 would proceed to step 904 again to perform burn in on the wafers in those new test stations. In the example being discussed, however, test station A 804*a* and test station B 804*b* are the only test stations in the system, and burn in has already been performed in those test stations. The process thus proceeds to step 906 to determine whether any messages have been received. If no, the process branches back to step 902.

If there is a message at step 906, the process of FIG. 9 decodes the message and takes whatever actions are indicated by the message. Messages are signals to tester I 802*a* to take some action. There are any number of possible messages and sources of messages. Two exemplary messages are shown in FIG. 9: a message from a test station currently in the system requesting to be taken off line or from a new test station requesting to brought on line; and a message from a test station indicating that burn in has been completed on the wafer or wafers in the cassette. The actions taken by tester I 802*a* in response to each of the foregoing messages is discussed below.

The process of FIG. 9 looks for a message from a test station requesting to be brought on line or to be taken off line at step 910. If such a message is detected, tester I 802*a* adds or removes the test station at step 912. Tester I 802*a* may add a new test station by adding the identifier of the new test station to a list of on line test stations stored in a memory in tester I. Similarly, tester I 802*a* may take a test station off line by removing its identifier from the list of on line test stations stored in the memory of tester I.

The process of FIG. 9 looks for a message from a cassette indicating that burn in has completed on the wafer or wafers in the cassette at step 914. If such a message is detected, tester I 802*a* collects from the cassette the results of the testing that occurred during burin at step 916. (Note that, as discussed above, it is assumed for purposes of this example that some testing occurs during burn in.) Tester I 802*a* collects test results by requesting the test results from the base controller 210 of the cassette, as described above with respect to step 712 of FIG. 7. Tester I 804*a* may also do such things as reset the temperature in the cassette. At step 918, tester I 802*a* determines whether burn in testing has completed in all of the cassettes in that test station. If no, tester I 802*a* returns to step 902. If yes, tester I 802*a* signals tester II 802*b* or tester III 802*c* that burn in has completed at that test station. At step 922 in FIG. 9, tester I 802*a* performs miscellaneous tasks. Alternatively, as soon as burn-in has completed in one cassette in a test station, tester II 802*b* or tester III 802*c* may commence its testing in the cassette, even though burn-in has not completed in other cassettes in the test station. Thereafter, once tester II 802*b* or tester III 802*c* has completed its testing in the cassette, that cassette may be loaded with a new wafer or wafers (even though testing is still occurring in other cassettes in the test station) and burn-in commenced on those new wafers.

FIG. 10 illustrates exemplary operation of tester II 802*b* and tester III 802*c*. That is, the process of FIG. 10 runs independently on both tester II 802*b* and tester III 802*c*. (The process of FIG. 10 may be implemented in software stored in a memory (not shown) and run on a controller (not shown) in tester II 802*b*, as is known in the field; the process may similarly be run on tester III 802*c*.) As described above, for purposes of this example, it is assume that both tester II 802*b* and tester III 802*c* are configured to perform full functional tests on the dies of the wafers in the cassettes 810*a*, 812*a*, 810*b*, and 812*b* and that each tester has sufficient resources to test the dies in one test station. (This assumption is made, however, only to simplify this discussion. Each tester may have fewer resources than necessary to test the dies in one test station, or each tester may have resources for testing wafers in more than one test station.)

FIG. 10 will be described with respect to tester II 802*b* running functional tests on the dies in test station A 804*a*. The process of FIG. 10, however, is equally applicable to tester II 802b running the tests on the dies in test station B 804b or to tester III 804c running functional tests on the dies in either test station A 804a or test station B 804b.

At step 1002, tester II 804b waits for a message, and if a message is received, the process of FIG. 10 decodes the message and takes whatever action or actions are indicated by the message. There are any number of possible messages and sources of messages. One example of a message is a message from tester I 802a indicating that burn in has been completed in one of test station A 804a or test station B 804b. If such a message is detected at step 1004, tester II 802b initiates functional tests on the dies in the cassettes of that test station at step 1006. Here, it will be assume that such a message is received indicating that burn in has been completed in station A 804a. Tester II 802b accordingly sends test data over communications link 806 to the base controllers 210 in each of cassettes 810a and 812a in test station A 804a. This may be accomplished as described above with respect to step 702 of FIG. 7. The step 1006 of testing devices in the cassettes 810a and 812a of test station A may require multiple sub-steps and may be time consuming. During execution of step 1006, the process may periodically check for other messages as at step 1002.

Another possible message is that the results of functional testing (step 1006) are ready in one of the cassettes 810a or 812a in test station A 804a. If such a message is detected at step 1010, tester II 802b collects the results of the functional testing from that cassette at step 1012, which tester II 802b may do by requesting the test results from the base controller 210 of the cassette, as generally described above with respect to step 712 of FIG. 7. At step 1014, tester II 802b performs miscellaneous tasks.

FIG. 11 illustrates exemplary operation of the base controllers 210 in each of cassettes 810a, 812a, 810b, and 812b. That is, the process of FIG. 11 runs independently on the base controllers 210 in each of cassettes 810a, 812a, 810b, and 812b. For ease of discussion, FIG. 11 will be described with respect to the base controller of cassette 810a in test station A 804a. (The process of FIG. 11 may be implemented in software stored in storage 408 and run on controller 402, as is known in the field.)

At steps 1102, 1106, 1110, 114, and 1118, the process of FIG. 11 looks for messages. One possible message indicates that new wafers have been loaded into the cassette 810a, which has been loaded into test station A 804a and is now ready for testing. Such a message may be generated internally by the base controller 210 or may be received from an external source, such as an operator activated button. If such a message is detected at step 1102, another message is generated and sent at step 1104 to tester I 802a indicating the presence of new wafers to be tested. Preferably, step 1104 is coordinated with other cassettes in the test station so that one message is sent from the test station once new wafers are loaded into all of the cassettes in the test station. (Note that such a message is detected and executed by tester I 802a at steps 906, 910, and 912 of FIG. 9.)

Another possible message is receipt of burn-in/test data from tester I 802a. (Burn-in/test data may include control signals for controlling burn-in as well as test data to be run on the dies during burn in.) If the receipt of burn-in/test data is detected at step 1106, the base controller 210 processes the data for controlling burn in and sends the test data to all of the WTC chips 214 in the cassette 810a. This may be accomplished as generally described above with respect to step 704 in FIG. 7. As also described above, with respect to steps 706 and 708 of FIG. 7, each WTC chip 214 writes the test data into a corresponding die of the wafer in cassette 810a and reads response data generated by the die. After reading the response data, a WTC chip 214 may send a message to the base controller 210 indicating that the response data is ready. If the base controller 210 in cassette 810a detects such a message at step 1110, the base controller collects the response data at step 1112 of FIG. 11, which may be accomplished generally as described above with respect to step 710 of FIG. 7.

Another possible message is a request from one of tester I 802a, tester II 802b, or tester III 802c for test results collected by the base controller 210. If such a message is detected at step 1114, the base controller 210 sends the requested test results over communications link 806 to the requesting tester. Steps 1118 and 1120 represent detection and execution of other miscellaneous commands or messages.

Figure 12:
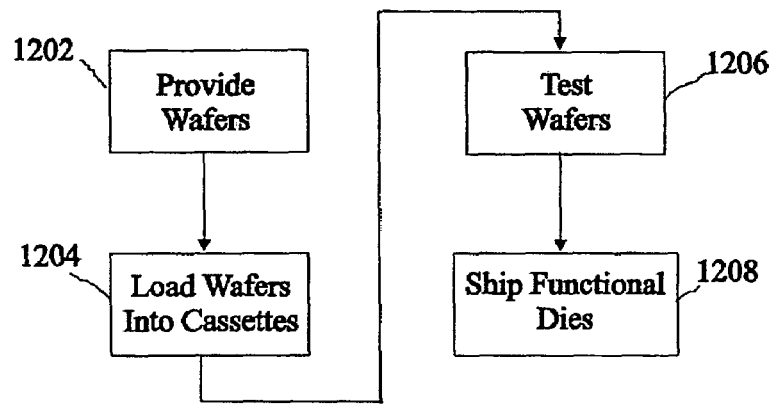
FIG. 12 illustrates exemplary manufacture of semiconductor dies.

FIG. 12 illustrates a process for manufacturing semiconductor dies. At step 1202, manufactured wafers with one or more dies are provided. At step 1204, the wafer is loaded into a cassette, which is loaded into a test system, such as the test system shown in FIG. 1 or FIG. 8. At step 1206, the dies of the wafer are tested, burned-in, and/or otherwise exercised using any of the processes described above. At step 1208, functional dies are shipped to customers.

It should be apparent that all of the processes illustrates in FIGS. 6, 7, 9, 10, 11, and 12 are exemplary and simplified. Provisions for error processing, exit from the process, and other similar functions may be added and are well within the skill of the ordinary practitioner and need not be discussed herein.

A nonlimiting advantage of using wireless communications to test electronic devices is that the number of electronic devices tested simultaneously by the tester may be increased beyond the tester's resources.

Figure 13:
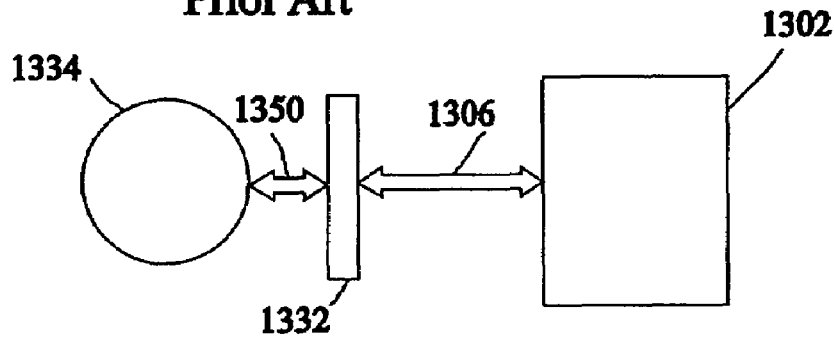
FIG. 13 illustrates a prior art test system.

FIG. 13 illustrates a prior art test system for testing a wafer 1334 using a probe card 1332. For ease of illustration, it is assumed that wafer 1334 has four dies (not shown), and each die includes two data input pads and two data output pads. Four data channels in communications link 1306 are thus required to test each die on wafer 1334. To test simultaneously all four dies on wafer 1334, 16 data channels in communications link 1306 are required. Eight of those channels would be configured to be down link channels for carrying test data to the two data input pads of each of the four dies on wafer 1334, and the other eight of those channels would be configured as up link channels for carrying response data generated by each die. Probe card 1332 would need 16 probes, one to contact each of the four pads on each of the four dies of wafer 1334.

In this example, it is further assumed that tester 1302 has sufficient resources to interface with 16 data channels in communications link 1306. Thus, in this simplified example, all of the tester's resources—in this example 16 channels—are used to test simultaneously all four of the dies of wafer 1334. If the number of dies on wafer 1334 is increased (e.g., because of a device shrink as is common in the semiconductor industry), however, the tester would no longer have sufficient resources to test simultaneously all of the dies on wafer 1334. For example, if due to a device shrink, six dies are made on wafer 1334, 24 data channels in communications link 1306 would be required to test simultaneously all six of the dies on wafer 1334.

Figure 14:
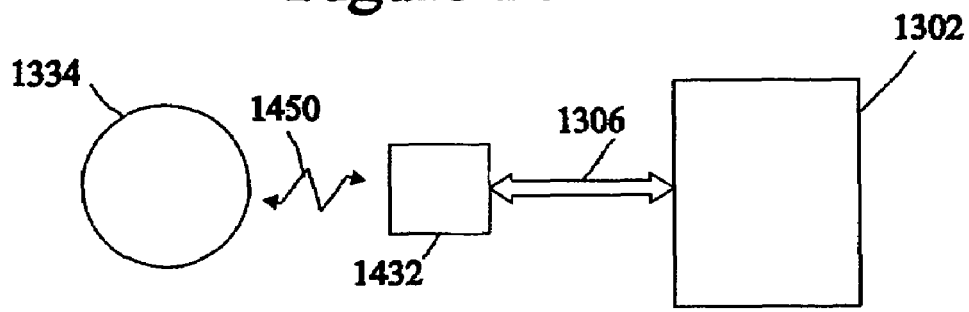
FIGS. 14, 15, and 16 illustrates three exemplary test systems

The use of wireless communications with the dies allows for a more efficient allocation of the tester 1302 resources. FIG. 14 illustrates a simplified block diagram of an exemplary test system that includes a tester 1302, a communications link 1306, a base controller 1432 (e.g., similar to the base controller shown in FIG. 4), and a wafer 1334 with dies to be tested. Although not shown, WTC chips (e.g., similar to the WTC chip shown in FIG. 5) are disposed on wafer 1334 or otherwise for controlling wireless communications between the dies of wafer 1334 and base controller 1432.

Returning to the above-described example in which wafer 1334 has six dies (each with two input data pads and two data output pads) and tester 1302 has sufficient resources to interface with 16 data channels in communications link 1306, the wireless system of FIG. 14 can be configured to test simultaneously all six of the dies of wafer 1334. Two of the 16 channels in communications link 1306 are configured as down link channels for carrying test data from the tester 1302 to the dies of wafer 1334, and 12 of the channels are configured as up link channels for carrying response data generated by the dies back to the tester. (Two of the 16 channels in communications link 1306 are unused in this example.) The base controller 1432 receives test data on the two down link channels and wirelessly broadcasts (via wireless link 1450) the test data to all six of the dies of wafer 1334. Base controller 1432 receives wirelessly (via wireless link 1450) response data generated by each of the six dies, and base controller 1432 sends the response data to the tester 1302 via the 12 up link channels of communications link 1306. Thus, the wireless test system shown in FIG. 14 is able to test simultaneously wafer 1334 even though the number of dies exceeds the resources of the tester 1302.

As another simplified example, suppose another device shrink occurs and eight dies are now made on wafer 1334. Two of the 16 channels in communications link 1306 may again be configured as down link channels for carrying test data from tester 1302 to base controller 1432, and all remaining 14 channels of communications link 1306 are configured as up link channels. Again, base controller 1432 receives test data on the two down link channels and wirelessly broadcasts (via wireless link 1450) the test data to all eight of the dies of wafer 1334. Base controller 1432 then receives wirelessly (via wireless link 1450) response data generated by each of the eight dies. In this example, base controller 1432 has received response data from eight dies, which would require 16 up link channels to return to tester 1302. There are, however, only 14 up link channels available. Using multiplexing techniques, the base controller 1432 sends the response data normally requiring 16 up link channels over the 14 available up link channels to the tester 1302.

Figure 15:
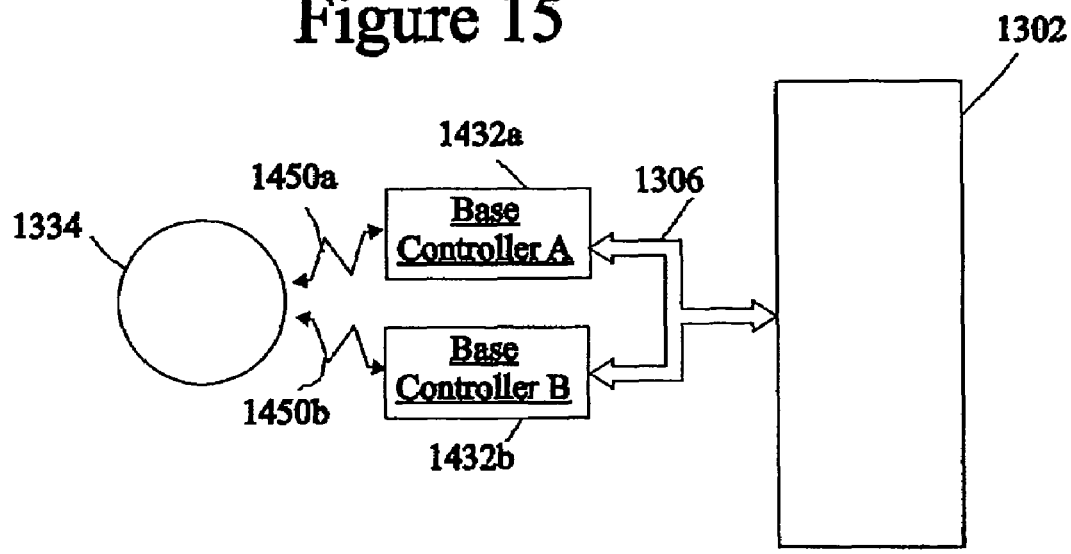

FIG. 15 illustrates an exemplary test system in which a plurality of (in this example two) base controllers 1432a and 1432b are used. Continuing with the above simplified example in which tester 1302 has sufficient resources to interface with 16 data channels of communications link 1306, suppose yet another device shrink occurs and now 16 dies are made on wafer 1334. In the example shown in FIG. 15, two of those 16 channels are configured as down link channels to base controller A 1432a and six channels are configured as up link channels from base controller A 1432a. Similarly, two channels are configured as down link channels to base controller B 1432b and six channels are configured as up link channels from base controller B 1432b. Both base controller A 1432a and base controller B 1432b receive test data via their respective down link channels, and each base controller 1432a and 1432b broadcasts the test data to a different group of eight dies on wafer 1334. Base controller A 1432a broadcasts the test data via wireless link 1450a, and base controller B 1432b broadcasts the test data via wireless link 1450b. Each base controller 1432a and 1432b then receives via the same wireless links 1450a and 1450b response data generated by the same groups of eight dies. Using multiplexing, base controller A 1434a then sends the response data collected from eight of the dies over its six up link channels of communications link 1306 to tester 1302. Also using multiplexing, base controller B 1434b sends the response data collected from the other eight of the dies over its six up link channels of communications link 1306 to tester 1302. The use of a plurality of base controllers may be particularly useful in situations in which the particular testing demands begin to approach or exceed the band width of the wireless communications link between a base controller and the dies.

Figure 16:
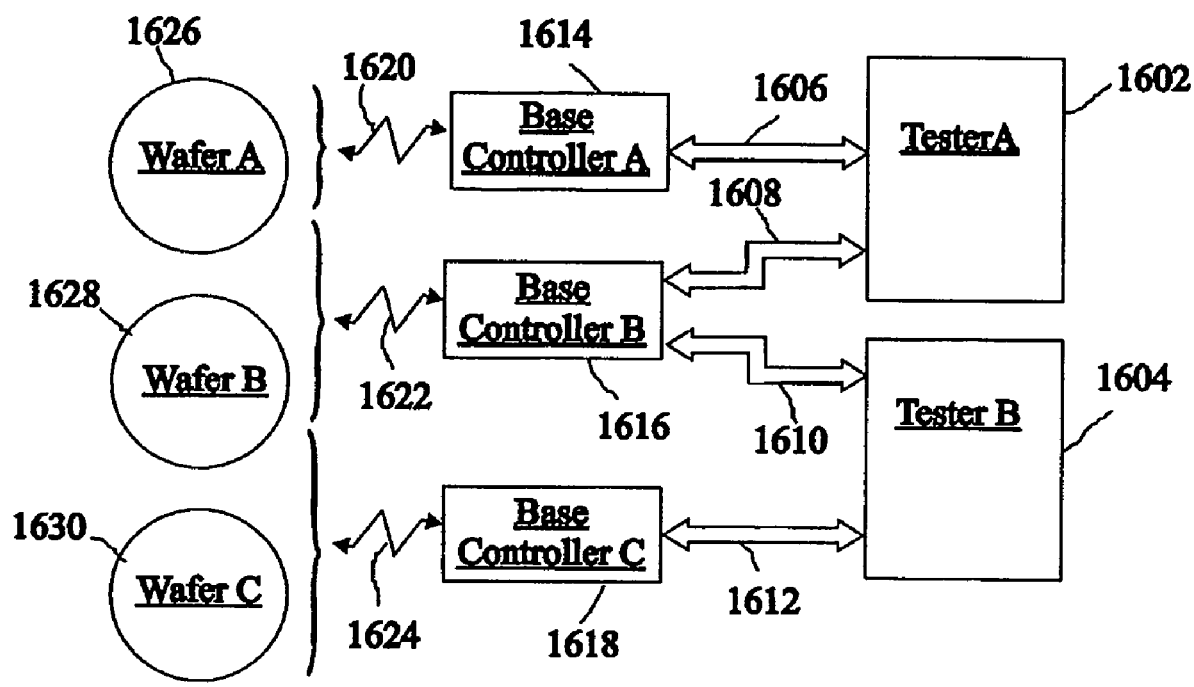

Wireless communications may also be used in a test system to balance data throughput and maximize efficiency. FIG. 16 illustrates an exemplary test system that includes two testers (tester A 1602 and tester B 1604) and three base controllers (base controller A 1614, base controller B 1616, and base controller C 1618) for testing three wafers (wafer A 1626, wafer B 1628, and wafer C 1630). Communications links 1606, 1608, 1610, and 1612 connect testers A and B (1602 and 1604) with base controllers A, B, and C (1614, 1616, and 1618), and wireless links 1620, 1622, and 1624 wirelessly connect base controllers A, B, and C (1614, 1616, and 1618) with WTC chips (not shown, but which may be similar to FIG. 5) disposed on wafers A, B, and C (1626, 1628, and 1630). (Tester A 1602 and tester B 1604 may be similar to any of the testers discussed above, and base controller A 1614, base controller B 1616, and base controller C 1618 may be similar to the base controller shown in FIG. 4.) The testers (1602 and 1604) may be connected to the base controllers (1614, 1616, and 1618) and the base controllers (1614, 1616, and 1618) to the wafers (1616, 1628, and 1630) in such a way as to balance data throughput and maximize efficiency, depending on the data throughput demands of the dies being tested or other demands of the system. This may result in an uneven allocation of communications resources.

For example, as shown in FIG. 16, one communications link 1606 connects tester A 1602 to base controller A 1614, and one communications link 1612 connects tester B 1604 to base controller 1618, but two communications links 1608 and 1610 connect base controller B 1616 to each of tester A 1602 and tester B 1604. As also shown in FIG. 16, wireless link 1620 wirelessly connects base controller A to a portion of the dies of wafer A 1626; wireless link 1622 wirelessly connects base controller B to a portion of the dies of wafer A 1626 and a portion of the dies of wafer B 1628; and wireless link 1624 wirelessly connects base controller C 1618 to a portion of the dies of wafer B 1628 and all of the dies of wafer C 1630.

The following provides one non-limiting example of balancing of data throughput for the system shown in FIG. 16. In this example, it is assumed that tester A 1602 supports transfer of data at speeds up to 100 megabits per second (MBPS) and tester B supports transfer of data at speeds up to 20 MBPS. It is also assumed that wafer A is capable of transferring data at speeds up to 60 MBPS, wafer B 1628 is capable of transferring data at speeds up to 50 MBPS, and wafer C 1630 is capable of transferring data at speeds up to 10 MBPS.

Given the foregoing assumptions, the system shown in FIG. 16 can be balanced by allocating 60 BMPS of the 100 MBPS available from tester A 1602 to communications link 1606 (the communications link between tester A 1602 and base controller A 1614); the remaining 40 BMPS of the 100 MBPS available from tester A 1602 to communications link 1608 (the communications link between tester A 1602 and base controller B 1616); 10 BMPS of the 20 MBPS available from tester B 1604 to communications link 1610 (the communications link between tester B 1604 and base controller B 1616); and the remaining 10 BMPS of the 20 MBPS available from tester B 1604 to communications link 1612 (the communications link between tester B 1604 and base controller C 1618). Test data is transferred across wireless link 1620 (that is, between base controller A 1614 and the portion of wafer A 1626 tested by base controller A 1614) at 60 MBPS; test data is transferred across wireless link 1622 (that is, between base controller B 1616 and the portion of wafer A 1626 and the portion of wafer B 1628 tested by base controller B 1616) at 50 MBPS; and test data is transferred across wireless link 1624 (that is, between base controller C 1618 and the portion of wafer B 1628 and the portion of wafer C 1630 tested by base controller C 1618) at 10 MBPS. The foregoing numerical values for data rates, etc. of the system shown in FIG. 16 are exemplary only and given for purposes of discussion and illustration only.

The foregoing embodiments are exemplary only, and many variations and modifications are possible. For example, a "wireless" interface may include hybrid variations of "wireless." In a complex factory floor environment, there may be hundreds or thousands of pieces of equipment engaged simultaneously in wireless communications. In such an environment, various methods of managing communications may be used. Cables may be used to distribute communications signals wide area wireless broadcasting stations. Such devices as signal repeaters (e.g., with directional antennas) may also be used. Thus, for example, the wireless links 1620, 1622, and 1624 may include such devices as cables interconnecting wireless broadcasting stations and/or signal repeaters. As another example of a possible variation, the two data probes in each probe set 228 may be replaced by electromagnetic coupling that accomplishes communication of test data and test results contactlessly as described in U.S. patent application Ser. No. 10/772,970, entitled "Contactless Interfacing Of Test Signals With A Device Under Test," by Miller et al., which is incorporated in its entirety herein by reference. Electromagnetic coupling is also discussed in Published U.S. Patent Application No. 20020186106, which is also incorporated in its entirety herein by reference. As yet another example, although one WTC chip is shown in the above examples for every one die under test, one WTC chip may correspond to two or more dies under test or more than one WTC chip may correspond to one die under test. As another example, portions of the WTC chip circuitry (e.g., see FIG. 5) may be implemented on a die. Indeed, the entire WTC chip circuitry could alternatively be implemented on a die.

The invention claimed is:

1. A test system comprising:
   a plurality of testers each configured to control testing of electronic devices, the plurality of testers comprising a first tester and a second tester;
   a test station configured to test a set of the electronic devices in accordance with test data received from the plurality of testers; and
   one or more communications links linking each of the testers to the test station, wherein:
   the first tester is configured to control testing of the set of electronic devices at the test station in accordance with a first type of testing; and
   the second tester is configured to control testing of the set of electronic devices at the test station in accordance with a second type of testing,
   wherein the second type of testing is different than the first type of testing.

2. The test system of claim 1, wherein the first tester and the second tester are configured to control sequential testing of the set of electronic devices such that the first type of testing and the second type of testing are performed sequentially.

3. A test system comprising:
   a plurality of testers each configured to control testing of electronic devices, the plurality of testers comprising a first tester and a second tester;
   a test station configured to test a set of the electronic devices in accordance with test data received from the plurality of testers; and
   one or more communications links linking each of the testers to the test station, wherein:
   the first tester is configured to control testing of the set of electronic devices at the test station in accordance with a first type of testing; and
   the second tester is configured to control testing of the set of electronic devices at the test station in accordance with a second type of testing,
   wherein the second type of testing is different than the first type of testing,
   wherein the first tester is configured to signal the second tester after completion of the first type of testing of the set of electronic devices at the test station.

4. The test system of claim 3, wherein the second tester is configured to start the second type of testing on the set of electronic devices at the test station after receiving the signal from the first tester that the first type of testing of the set of electronic devices at the test station is completed.

5. The test system of claim 4, wherein the first tester is configured to start the first type of testing on the set of electronic devices at the test station after receiving a signal from the test station requesting testing of the electronic devices at the test station.

* * * * *